(12) United States Patent
Sankavaram et al.

(10) Patent No.: US 12,202,374 B2
(45) Date of Patent: Jan. 21, 2025

(54) HEALTH MONITORING METHODS FOR EARLY FAULT DETECTION IN HIGH VOLTAGE BATTERY PACKS USED IN ELECTRIC VEHICLES

(71) Applicant: GM GLOBAL TECHNOLOGY OPERATIONS LLC, Detroit, MI (US)

(72) Inventors: Chaitanya Sankavaram, Rochester Hills, MI (US); Ning Wang, Rochester Hills, MI (US); Yilu Zhang, Northville, MI (US); Ciro A. Spigno, Leonard, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 501 days.

(21) Appl. No.: 17/516,279

(22) Filed: Nov. 1, 2021

(65) Prior Publication Data

US 2023/0137625 A1    May 4, 2023

(51) Int. Cl.
| | |
|---|---|
| *B60L 58/10* | (2019.01) |
| *G01R 31/367* | (2019.01) |
| *G01R 31/389* | (2019.01) |
| *G01R 31/392* | (2019.01) |
| *G01R 31/396* | (2019.01) |
| *H02J 7/00* | (2006.01) |

(52) U.S. Cl.
CPC ............ *B60L 58/10* (2019.02); *G01R 31/367* (2019.01); *G01R 31/389* (2019.01); *G01R 31/392* (2019.01); *G01R 31/396* (2019.01); *H02J 7/0013* (2013.01); *H02J 7/005* (2020.01)

(58) Field of Classification Search
CPC .......... B60L 58/10; B60L 58/12; B60L 58/21; B60L 2240/545; B60L 2240/549; B60L 3/0046; G01R 31/367; G01R 31/389; G01R 31/392; G01R 31/396; H02J 7/0013; H02J 7/005
See application file for complete search history.

(56) References Cited

U.S. PATENT DOCUMENTS

| | | | | |
|---|---|---|---|---|
| 2005/0182536 | A1* | 8/2005 | Doyle ................ | G01R 31/3647 340/455 |
| 2013/0200902 | A1* | 8/2013 | Kurimoto ............ | G01R 31/385 429/158 |
| 2013/0325379 | A1* | 12/2013 | Nakamura .......... | G01R 31/3835 702/63 |
| 2017/0201103 | A1* | 7/2017 | Jeon ...................... | H02J 7/0014 |

OTHER PUBLICATIONS

U.S. Appl. No. 17/516,223, filed Nov. 1, 2021, Sankavaram et al.

* cited by examiner

*Primary Examiner* — Catherine T. Rastovski
*Assistant Examiner* — Lal C Mang

(57) ABSTRACT

A system for monitoring a battery of a vehicle includes a processor and a memory storing instructions which when executed by the processor configure the processor to receive first features including statistics of internal resistances of a plurality of cell groups in a battery pack of the battery, compute second features for the battery pack based on the first features, determine whether the battery pack is faulty based on one or more of the second features, and determine, in response to the battery pack being faulty, whether one or more of the cell groups is faulty based on one or more of the first features.

14 Claims, 12 Drawing Sheets

HEALTH MONITORING METHODS FOR EARLY FAULT DETECTION IN HIGH VOLTAGE BATTERY PACKS USED IN ELECTRIC VEHICLES

CROSS-REFERENCE TO RELATED APPLICATIONS

This application is related to U.S. patent Application Ser. No. 17/516,223 filed on [the same day]-Nov. 1, 2021_and entitled "RESISTANCE ESTIMATION OF HIGH VOLTAGE BATTERY PACKS DURING VEHICLE DRIVING OPERATION." The entire disclosure of the application referenced above is incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates generally to electric vehicles and more particularly to health monitoring methods for early fault detection and/or predicting failures in high voltage battery packs used in electric vehicles.

Use of electric vehicles is proliferating. The electric vehicles are powered by batteries. Performance of the batteries tends to degrade over time. The batteries may also develop problems during use. For example, one or more cells in a battery pack may develop problems and/or degrade faster than other cells in the battery pack. An internal resistance of a battery changes as the battery ages. For example, the internal resistance increases due to changes in temperature, state of charge, and current drawn from the battery. The internal resistance also changes if one or more cells in a battery pack develop problems. The changes in the internal resistance of the battery can indicate degradation of battery performance over time and can be used to detect problems that may develop in the battery during use.

SUMMARY

A system for monitoring a battery of a vehicle comprises a processor and a memory storing instructions which when executed by the processor configure the processor to receive first features including statistics of internal resistances of a plurality of cell groups in a battery pack of the battery, compute second features for the battery pack based on the first features, determine whether the battery pack is faulty based on one or more of the second features, and determine, in response to the battery pack being faulty, whether one or more of the cell groups is faulty based on one or more of the first features.

In another feature, the instructions further configure the processor to identify one or more of the faulty cell groups that contributes maximally to the faulty battery pack based on one of the second features indicating that the battery pack is faulty and the one or more of the first features of the faulty cell groups.

In another feature, the instructions further configure the processor to determine a fault severity level in response to the battery pack and the one or more of the cell groups being faulty.

In another feature, the instructions further configure the processor to provide an indication regarding the battery pack and the one or more of the cell groups being faulty and the fault severity level.

In another feature, the internal resistances of the cell groups include at least one of charge and discharge resistances of the cell groups.

In another feature, the instructions further configure the processor to determine that the battery pack is faulty in response to the one or more of the second features deviating from respective normal values by respective thresholds (i) for one or more drive cycles of the vehicle or (ii) progressively during a plurality of drive cycles of the vehicle.

In another feature, the instructions further configure the processor to determine that the one or more of the cell groups is faulty in response to the one or more of the first features deviating from respective normal values by respective thresholds (i) for one or more drive cycles of the vehicle or (ii) progressively during a plurality of drive cycles of the vehicle.

In another feature, the first features include at least maximum, minimum, and average internal resistance values for each of the cell groups, and the instructions further configure the processor to compute the second features using combinations of maximum, minimum, and average values of the first features.

In another feature, the instructions further configure the processor to adjust the first features based on one or more parameters of the battery before computing the second features based on the first features.

In another feature, the instructions further configure the processor to normalize the second features based on one or more parameters of the battery before determining whether the battery pack is faulty based on one or more of the second features.

In still other features, a method for monitoring a battery of a vehicle comprises receiving first features including statistics of internal resistances of a plurality of cell groups in a battery pack of the battery, computing second features for the battery pack based on the first features, determining whether the battery pack is faulty based on one or more of the second features, and determining, in response to the battery pack being faulty, whether one or more of the cell groups is faulty based on one or more of the first features.

In another feature, the method further comprises identifying one or more of the faulty cell groups that contributes maximally to the faulty battery pack based on one of the second features indicating that the battery pack is faulty and the one or more of the first features of the faulty cell groups.

In another feature, the method further comprises determining a fault severity level in response to the battery pack and the one or more of the cell groups being faulty.

In another feature, the method further comprises providing an indication regarding the battery pack and the one or more of the cell groups being faulty and the fault severity level.

In another feature, the method further comprises determining the internal resistances of the cell groups including at least one of charge and discharge resistances of the cell groups.

In another feature, the method further comprises determining that the battery pack is faulty in response to the one or more of the second features deviating from respective normal values by respective thresholds (i) for one or more drive cycles of the vehicle or (ii) progressively during a plurality of drive cycles of the vehicle.

In another feature, the method further comprises determining that the one or more of the cell groups is faulty in response to the one or more of the first features deviating from respective normal values by respective thresholds (i) for one or more drive cycles of the vehicle or (ii) progressively during a plurality of drive cycles of the vehicle.

In another feature, the method further comprises computing the first features including at least maximum, minimum, and average internal resistance value for each of the cell groups, and the method further comprises computing the second features using combinations of maximum, minimum, and average values of the first features.

In another feature, the method further comprises adjusting the first features based on one or more parameters of the battery before computing the second features based on the first features.

In another feature, the method further comprises normalizing the second features based on one or more parameters of the battery before determining whether the battery pack is faulty based on one or more of the second features.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
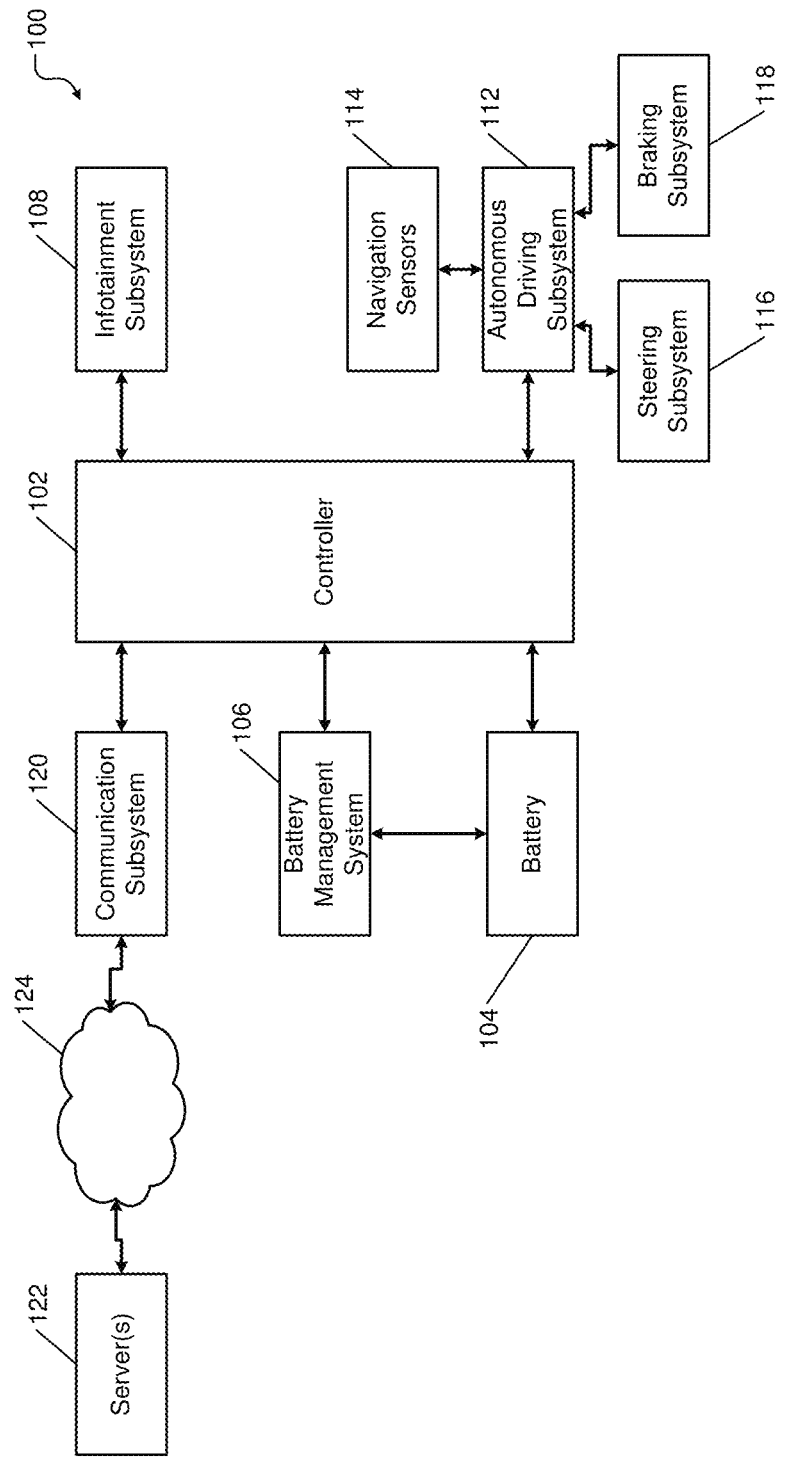
FIG. 1 shows an example of a control system of an electric vehicle.

The present disclosure provides a system and a method to detect and predict health conditions of high voltage battery packs used in electric vehicles. The system and method utilize health indicators such as discharge and charge resistances of the battery to detect and predict the health conditions of the battery packs and cell groups in the battery packs. The system and method provide enhanced monitoring capabilities to monitor a battery (at pack, module, and cell group level) for detecting high internal resistances of the cell groups as a failure condition. The system and method provide early detection and prognostics capabilities for predicting battery degradation.

The present disclosure provides an automated system to monitor and predict battery pack failures. As explained below in detail, in the automated system, several features are derived from summary statistics of internal resistances of cell groups in a battery pack. The derived features are used for robustly detecting and isolating a faulty battery pack. Specifically, the system monitors the health of a high voltage battery pack to detect/predict failure conditions by hierarchically using health indicators such as discharge and charge resistances at battery pack level and cell group level. The system uses a combination of these features to allow fault detection and identification that is robust in the presence of various noise and environmental factors. The system performs a severity assessment using a set of features to provide an early detection and prediction of failures in battery packs. The system proactively monitors failure progression and sends alerts/notifications to warn users ahead of a failure and to avoid vehicle stalls. The system provides progressive trends regarding the health of the battery and provides early warning to users ahead of a failure. The system manages the vehicle operation when faults are detected.

More specifically, the system and method for monitoring the health of the battery pack and for early fault identification uses two tiered procedures that utilize statistical features computed based on charge and discharge resistances of the individual cell groups in a high voltage battery pack. In a first procedure, the system derives pack-level features from the statistical features associated with the cell groups to detect degrading battery packs. In a second procedure, the system uses the cell group level statistical features to isolate failure to one or more individual cell groups. The system uses the pack-level and cell-group level features for fault prediction. The system assesses and indicates a severity level of the fault and provides early warning to users regarding failure(s). The system employs a severity index derived from the internal resistances of the cell groups for early fault detection and for learning different types of battery-related failure modes. The system and method can be implemented in the vehicle, cloud, or using combination thereof. These and other features of the present disclosure are described below in detail.

Figure 12A:
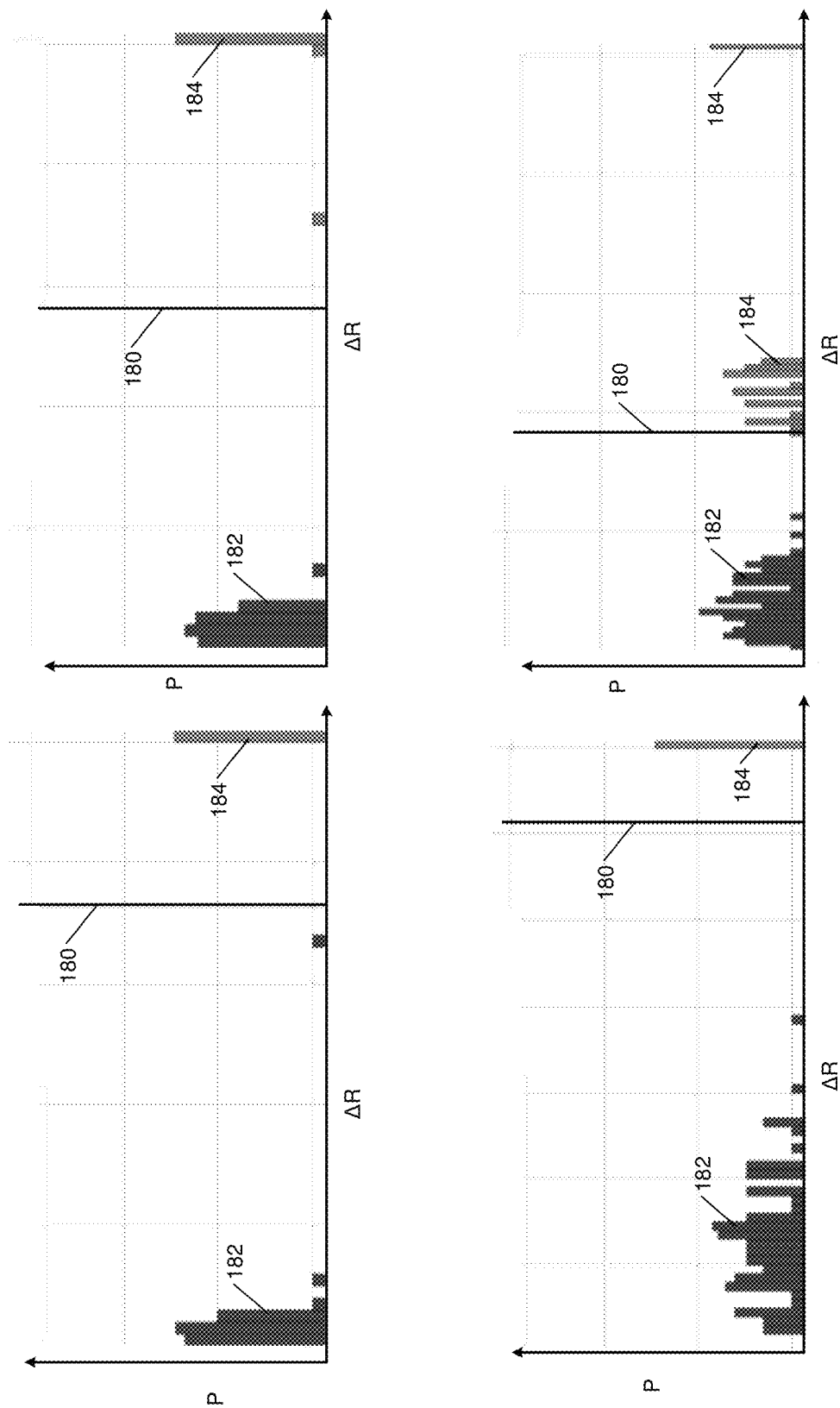
FIGS. 12A and 12B show examples of the pack level features.
Figure 12B:
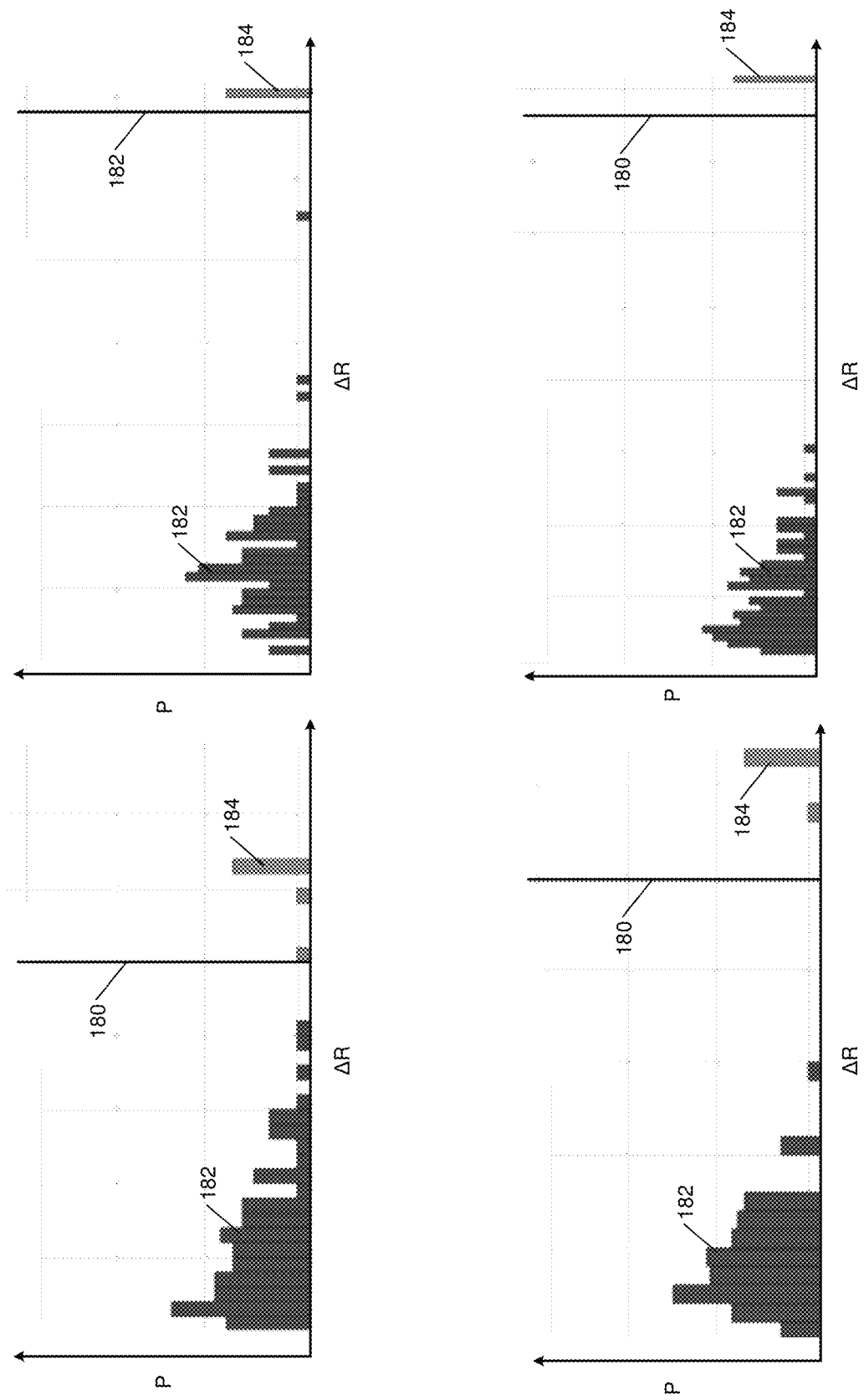
Figure 13:
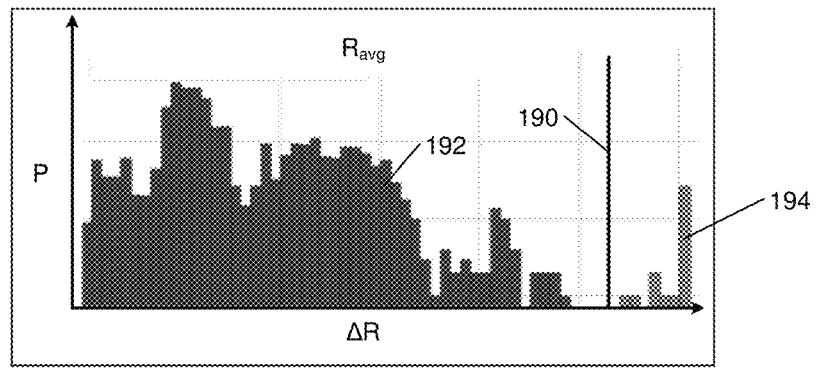
FIG. 13 shows examples of the cell group level features.
Figure 13:
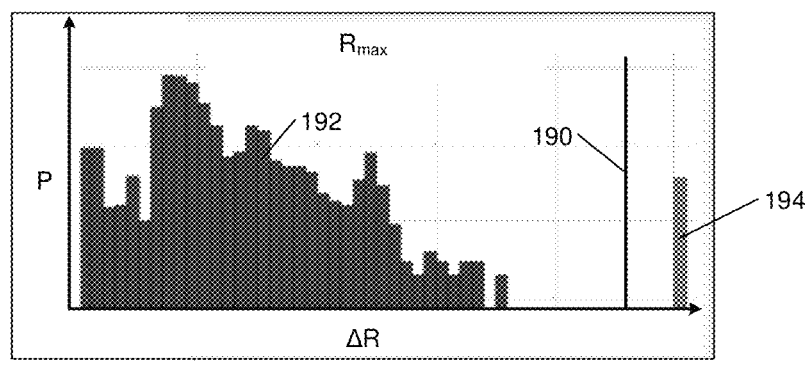
Figure 13:
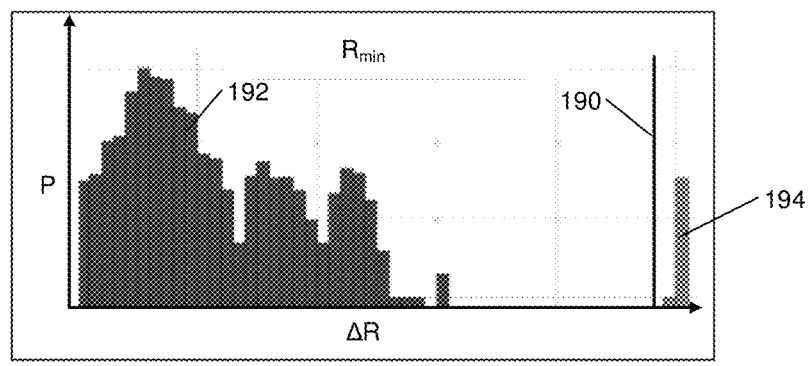

The present disclosure is organized as follows. Initially, a block diagram of a control system of an electric vehicle is shown and described with reference to FIG. 1. Examples of cell groups of a battery of the electric vehicle are shown and described with reference to FIGS. 2A and 2B. Examples of factors affecting the internal resistances of the battery are shown and described with reference to FIGS. 3A-3C. An example of a current profile of the battery during a drive cycle of the electric vehicle and examples of operating regions defined in the current profile are shown and described with reference to FIG. 4. An example of a health monitoring system for the battery is shown and described with reference to FIG. 5. An overall method used by the health monitoring system of FIG. 5 to identify a faulty battery pack and faulty cell group(s) in the battery is shown and described with reference to FIG. 6. Subsequently, the steps of the method of FIG. 6 are shown and described in further detail with reference to FIGS. 7-11. The pack level and cell group level features used by the method of FIG. 6 are shown in FIGS. 12A, 12B, and 13.

FIG. 1 shows an example of a control system 100 of an electric vehicle. The control system 100 comprises a controller 102, a battery 104, a battery management system (BMS) 106, an infotainment subsystem 108, and an autonomous driving subsystem (implementing SAE Levels 1-5) 112. The controller 102 communicates with the battery 104 and implements a health monitoring system shown and described below in detail with reference to FIG. 5. The controller 102 communicates with the various subsystems of the vehicle. The battery 104 supplies power to the various subsystems of the electric vehicle. The BMS 106 performs battery management operations, which include monitoring the battery 104 and supplying power from the battery 104 to the various subsystems of the vehicle. The health monitoring system can also be implemented in the BMS 106.

The infotainment subsystem 108 may include audiovisual multimedia subsystems and a human to machine interface (HMI) that allows occupants of the electric vehicle to interact with the control system 100. The infotainment subsystem 108 also provides alerts provided by the health monitoring system to the occupants of the electric vehicle via the HMI.

The control system 100 further comprises a plurality of navigation sensors 114 that provide navigation data to the autonomous driving subsystem 112. For example, the navigation sensors 114 may include cameras, radar and Lidar sensors, a global positioning system (GPS), and so on. Based on the data received from the navigation sensors 114, the autonomous driving subsystem 112 controls a steering subsystem 116 and a braking subsystem 118 of the electric vehicle. The autonomous driving subsystem 112 also controls and manages the operation of the electric vehicle based on data regarding the health of the battery 104 received from the health monitoring system (e.g., from the controller 102 or the BMS 106). Note that the autonomous driving subsystem 112 is shown for example only; and the capabilities of the health monitoring system described in the present disclosure are also applicable to electric vehicles that are non-autonomous.

The control system 100 further comprises a communication subsystem 120 that can communicate with one or more servers 122 in a cloud via a distributed communications network 124. For example, the distributed communications network 124 may include a cellular network, a satellite-based communication network, a Wi-Fi network, the Internet, and so on. The communication subsystem 120 may include one or more transceivers for communicating with the distributed communications network 124. The controller 102 communicates with the one or more servers 122 in the cloud via the communication subsystem 120. The controller 102 communicates the data from the battery 104 processed by the health monitoring system (described below) to the one or more servers 122 via the communication subsystem 120. The controller 102 generates alerts based on the data from the battery 104 processed by the health monitoring system and provides the alerts to the occupants of the electric vehicle via the HMI of the infotainment subsystem 108. The controller 102 may also receive alerts from the one or more servers 122 based on the data from the battery 104 processed by the one or more servers 122 and provides the alerts to the occupants of the electric vehicle via the HMI of the infotainment subsystem 108.

Figure 2A:
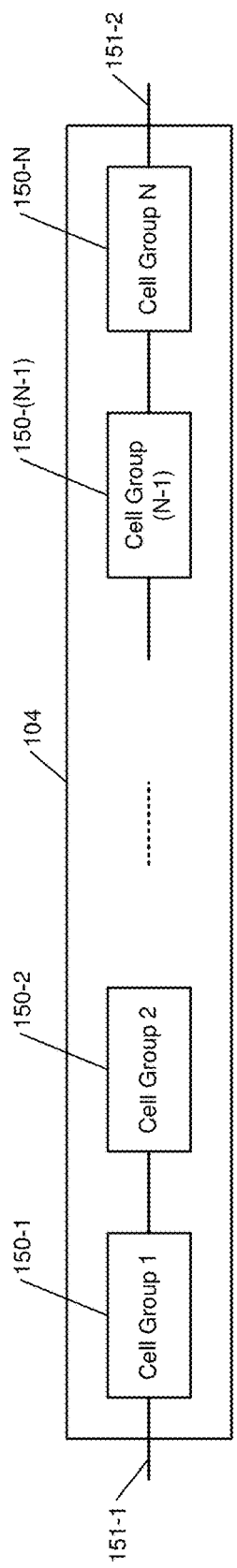
FIGS. 2A and 2B show an example of a battery of the electric vehicle comprising cell groups.
Figure 2B:
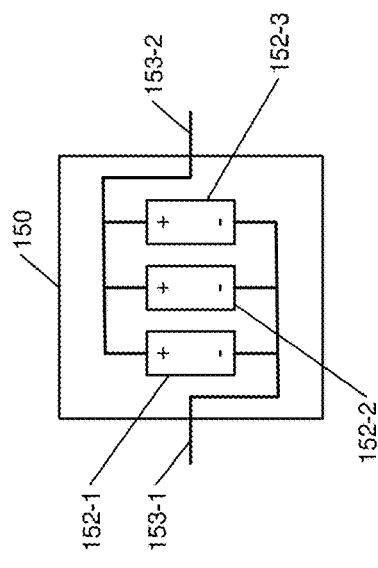

FIGS. 2A and 2B shows an example of the battery 104 comprising one or more battery packs. Hereinafter, the term battery and battery pack are used interchangeably. In general, the battery 104 may comprise a plurality of battery packs. Each battery pack may comprise a plurality of modules. Each module may comprise a plurality of cell groups. Each cell group may comprise a plurality of cells.

In FIG. 2A, the battery 104 comprises one or more battery packs each comprising a plurality of cell groups. For example, the battery 104 comprises cell group 1 150-1, cell group 2 150-2, . . . , cell group 150-(N-1), and cell group N 150-N, where N is a positive integer (collectively the cell groups 150). The cell groups 150 are connected to each other in series. For each battery pack comprising the cell groups 150, a pack level current I through the cell groups 150 of the battery pack is measured by measuring current through terminals 151-1, 151-2 (collectively the terminals 151) of the battery pack comprising the cell groups 150. The current measurement is described below with reference to FIG. 5.

In FIG. 2B, each cell group 150 comprises a plurality of cells (e.g., 3 cells). For example, each cell group 150 comprises cells 152-1, 152-2, and 152-3 (collectively the cells 152). While only 3 cells are shown for example only, each cell group 150 may include fewer or more than three cells 152. The cells 152 in each cell group 150 are connected to each other in parallel, in series, or using a combination of series and parallel connections. Voltages across each individual cell group 150 are measured across terminals 153-1, 153-2 (collectively the terminals 153) of each cell group 150. The voltage measurements are described below with reference to FIG. 5.

Accordingly, for each battery pack comprising the N cell groups 150, the pack level current I (also called the battery current I throughout the present disclosure) and N voltages across the N cell groups 150 are measured. The current I can be measured during charging and discharging cycles of the battery 104. These current and voltage measurements allow calculations of internal resistances of each individual cell group 150 during charging and discharging cycles of the battery 104. The internal resistance of the battery 104 can be used as a health indicator to indicate the health of the battery 104. Specifically, various statistics can be computed from the internal resistances calculated for each cell group 150 during charging and discharging cycles of the battery 104. For example, the statistics can include maximum, minimum, average, and other values of the internal resistances for each cell group 150. The statistics can be used to initially formulate pack level features that are used to determine if a battery pack is faulty. Subsequently, if a battery pack is faulty, cell group level features (i.e., the statistics) are used to identify and isolate a faulty cell group 150 within the faulty battery pack as described below in detail with reference to FIGS. 6-11.

The health monitoring system, which is shown and described below in detail with reference to FIG. 5, measures the internal resistances of the cell groups 150 by taking into account various factors that impact the internal resistance of the battery 104. For example, the factors include but are not limited to temperature, state of charge (SOC), and current of the battery 104. Accordingly, the internal resistance measurements and the statistics computed based on the internal resistance measurements are robust (i.e., independent of the noise and the operating conditions of the battery 104). Consequently, the health monitoring system can detect and isolate a faulty battery pack and a faulty cell group 150 that contributes the most to the performance degradation of the battery 104 in a robust manner. To identify a faulty battery pack and a faulty cell group 150, the health monitoring system can process the pack level features and the cell group level features in the onboard controller (e.g., the controller 102), in the cloud (e.g., in the one or more servers 122), or using a combination of both. The health monitoring system can provide the health indication of the battery 104 in the form of a severity level and proactive alerts to an occupant of the electric vehicle and to service technicians for prognostics and diagnostics purposes as described below in detail.

Figure 3A:
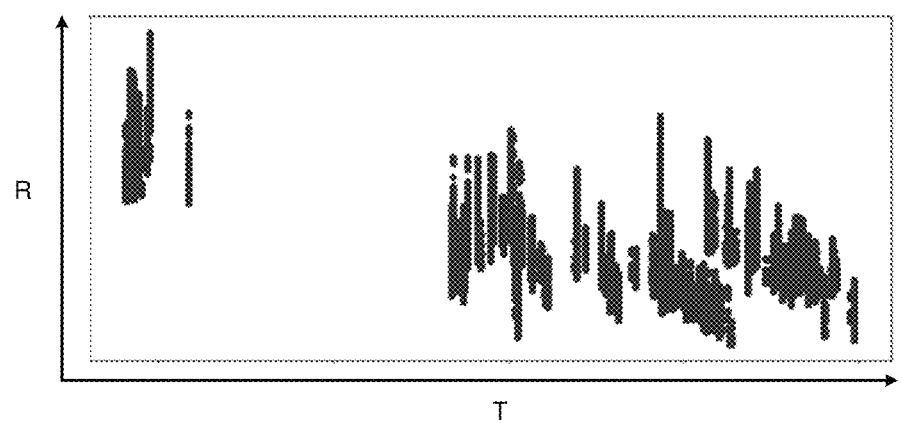
FIGS. 3A-3C show examples of factors affecting an internal resistance of the battery.
Figure 3B:
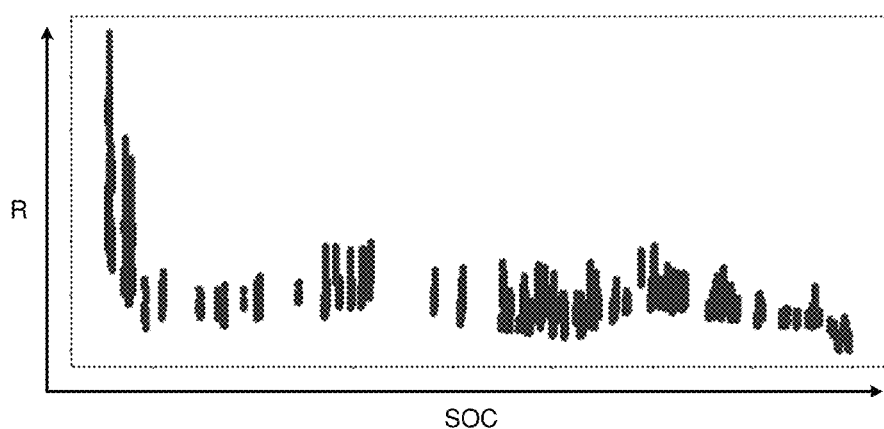
Figure 3C:
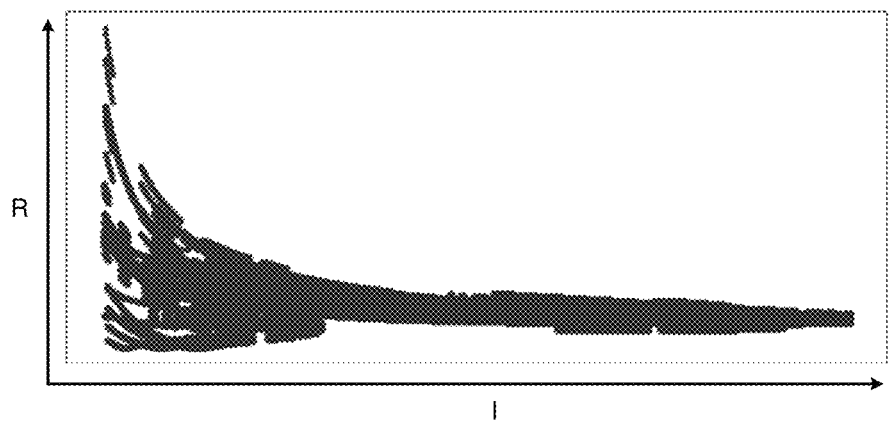

FIGS. 3A-3C show how the internal resistance of the battery 104 is impacted by various factors such as temperature, SOC, and current of the battery 104. For example, in FIG. 3A, if the current I and SOC of the battery 104 are within a narrow range, the internal resistance R of the battery 104 is higher at lower temperatures T of the battery 104 and lower at higher temperatures T of the battery 104. In FIG. 3B, if the temperature T and current I of the battery 104 are within a narrow range, the internal resistance R of the battery 104 is higher when SOC of the battery 104 is lower and lower when SOC of the battery 104 is higher. In FIG. 3C, if the temperature T and SOC of the battery 104 are within a narrow range, the internal resistance R of the battery 104 is lower when the current I of the battery 104 is higher (supposing the current I is a discharge current) and lower when the current I of the battery 104 is higher.

Accordingly, the internal resistance of the battery 104 varies differently depending on the temperature, SOC, and current of the battery 104. Consequently, the internal resistance data of the battery 104, when measured over the entire current profile of the battery 104, which includes various vehicle speeds, are not comparable due to the different operating conditions of the battery 104 over the entire current profile of the battery 104. Therefore, the health monitoring system divides the current profile of the battery 104 into narrow operating regions and measures the current of the battery 104 and the voltages of the cell groups 150 in each operating region to smooth out the effects of the operating conditions.

Figure 4:
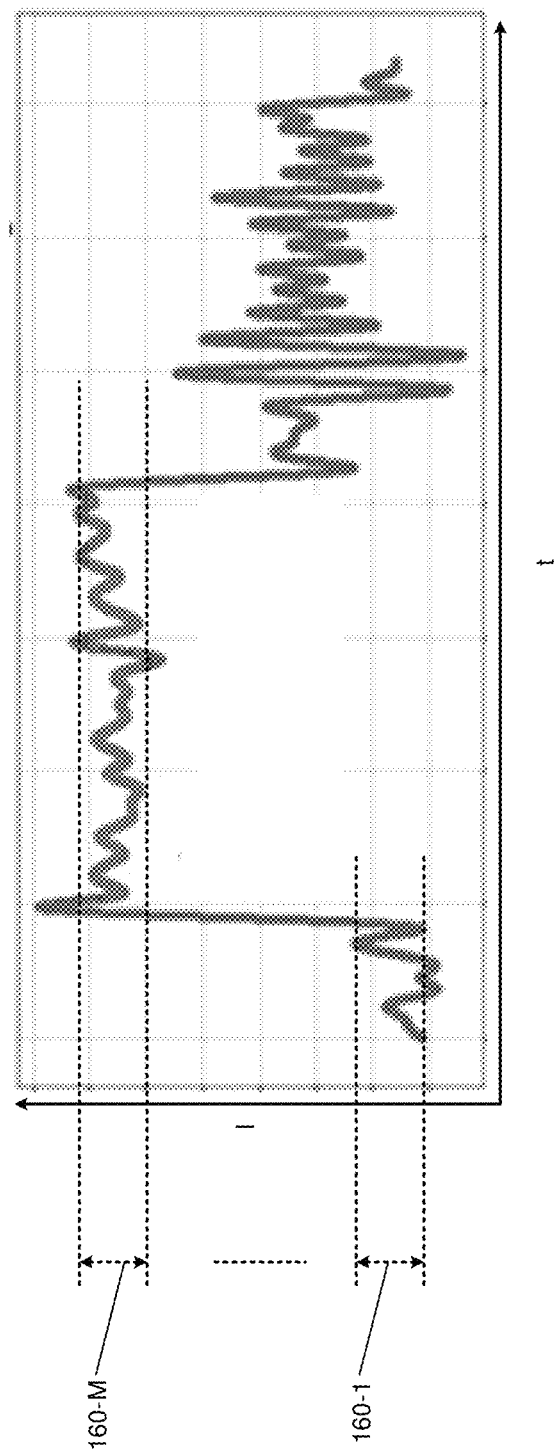
FIG. 4 shows an example of a current profile of the battery during a drive cycle of the electric vehicle.

FIG. 4 shows an example of a current profile of the battery 104 in a drive cycle. For example, the drive cycle is a trip made by the vehicle. For example, suppose that in a trip, the vehicle initially moves at a slower speed (e.g., on a surface street), then moves at a relatively constant speed (e.g., on a highway), then again moves at varying lower and higher speeds (e.g., on surface streets). The current profile of the battery 104 during the trip varies depending on the speed of the vehicle. For example, the current may be lower at slower speeds of the vehicle and higher at higher speeds of the vehicle.

Since the current and the operating conditions of the battery 104 vary during the trip, the entire current profile of the battery 104 is not selected for the current and voltage measurements. Instead, a plurality of operating regions 160-1, . . . , and 160-M, where M is a positive integer (collectively the operating regions 160) of the current profile of the battery 104 over the drive cycle are selected. Each operating region 160 is a function of the current I, SOC, and temperature T of the battery 104. Each operating region 160 is selected where the current is relatively stable (i.e., is within a narrow range) at time t for a selected SOC and temperature T of the battery 104. The selected SOC and temperature T of the battery 104 can be calibrated parameters. For example, theses parameters can be set when the vehicle is manufactured and can be altered via updates provided to the vehicle during the life of the vehicle. The internal resistances of the cell groups 150 are measured in the operating regions 160, and the statistics (e.g., $R_{max}$, $R_{min}$, $R_{avg}$, and other statistical parameters) are computed based on the measured internal resistances. The statistics (also called the summary statistics throughout the present disclosure) are then analyzed using two tiered procedures to detect a faulty battery pack and a faulty cell group 150 within the faulty battery pack as described below with reference to FIGS. 6-11.

Figure 5:
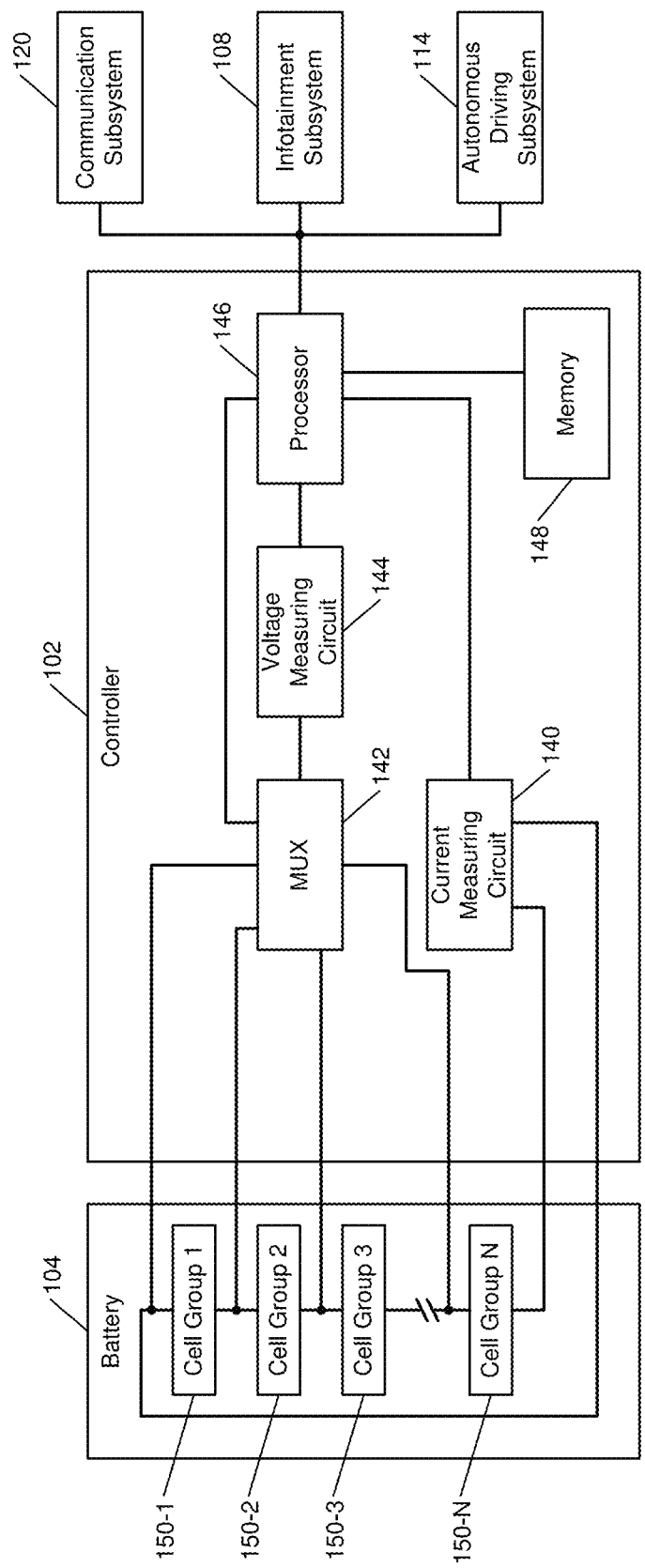
FIG. 5 shows an example of a health monitoring system for the battery.
Figure 6:
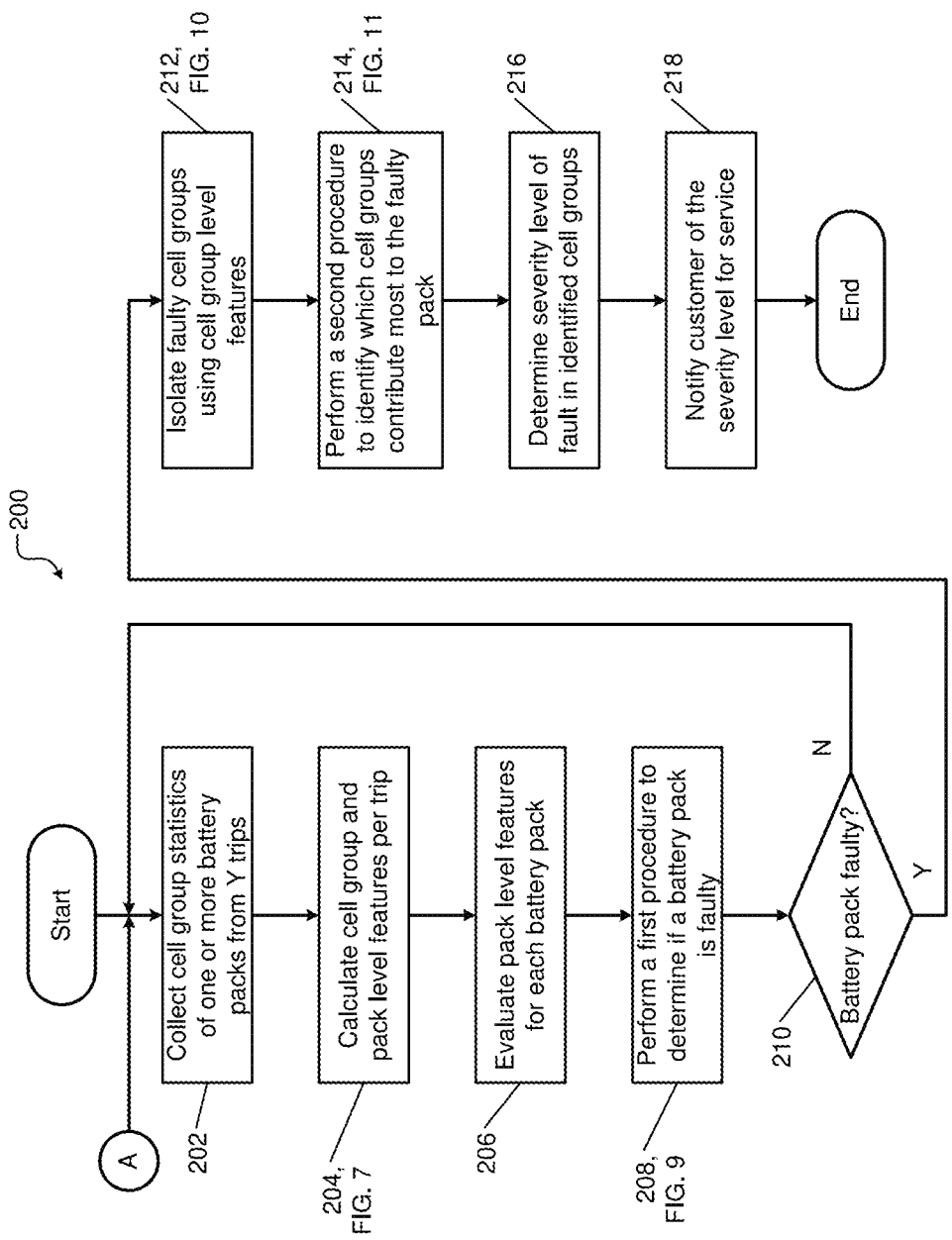
FIG. 6 show a method of identifying a faulty battery pack and faulty cell groups in the battery.

FIG. 5 shows an example of the health monitoring system implemented in the controller 102. The health monitoring system comprises a current measuring circuit 140, a multiplexer 142, a voltage measuring circuit 144, a processor 146, and memory 148. The current measuring circuit measures the current I through the N cell groups 150 during charging and discharging cycles of the battery 104. The multiplexer 142 connects the voltage measuring circuit 144 across each of the cells groups 150. The processor 146 controls the multiplexer 142. The voltage measuring circuit 144 measures the voltages across each of the cells groups 150. The processor 146 processes the current and voltage measurements, calculates the internal resistances of the cell groups 150, and computes the statistics for the cell groups 150 based on the internal resistance measurements. For example, the statistics comprise $R_{max}$, $R_{min}$, $R_{avg}$, and other values such as standard deviation, variance, and so on for the internal resistance of each cell group 150. The statistics are computed for each trip made by the vehicle and are stored in the memory 148. The statistics are used as the cell group level features.

The processor 146 derives pack level features from the summary statistics and analyzes the pack level features using a first pack level procedure to detect a faulty battery pack. The processor 146 analyzes the cell group level features (i.e., the statistics) using a second procedure to isolate a faulty cell group 150 within the faulty battery pack as described below with reference to FIGS. 6-11.

FIG. 6 shows an overall a method 200 for detecting a fault in a battery pack of the battery 104 and for detecting a faulty cell group 150 in the faulty battery pack according to the present disclosure. FIGS. 7-11 show some of the steps of the method 200 in further detail. The method 200 is performed by the health monitoring system of FIG. 5. For example, the processor 146 along with the other circuits of the controller 102 may perform the method 200.

FIG. 6 shows an overall method for detecting a faulty battery pack and a faulty cell group 150 in the faulty battery pack. At 202, the method 200 collects the statistics ($R_{max}$, $R_{min}$, $R_{avg}$, and other statistical values) computed for the cell groups 150 of one or more battery packs of the battery 104. The method 200 collects the statistics from Y trips made by the vehicle, where Y is a positive integer. For example, the method 200 collects the statistics stored in the memory 148 of the controller 102. In addition, the method receives an average current I, an average SOC, and an average temperature of the battery 104. For example, the method 200 receives these measurements for each battery pack, each module within each battery pack, and/or each cell group 150. These statistics and measurements are stored in the memory 148 of the controller 102 for every trip made by the vehicle.

At 204, the method 200 computes cell group level features and pack level features based on the cell group level features per trip. The method 200 computes the cell group level features and pack level features from the statistics as explained below in detail with reference to FIGS. 7 and 8.

At 206, the method 200 evaluates the pack level features for each battery pack. At 208, the method 200 performs a first procedure to evaluate the pack level features and determines if a battery pack is faulty. The first procedure is shown and described below in detail with reference to FIG. 9. At 210, the method 200 determines if the battery pack is faulty. The method 200 returns to 202 if the method 200 determines that the battery pack is not faulty.

If the battery pack is faulty, at 212, the method 200 isolates one or more cell groups 150 that are faulty in the faulty battery pack using the cell group level features. The method 200 isolates one or more faulty cell groups 150 in the faulty battery pack using a methodology shown and described below in detail with reference to FIG. 10. At 214, the method 200 performs a second procedure to identify which cell group(s) 150 contribute most to the fault in the faulty battery packs. The second procedure is shown and described below in detail with reference to FIG. 11.

At 216, the method 200 determines a severity level of the fault in the cell groups 150 identified as contributing most to the fault in the faulty battery pack. At 218, the method 200 notifies the user of the fault (e.g., which pack is faulty and which cell group(s) is faulty in the faulty battery pack) and the severity level of the fault, which is described below, so that service can be scheduled to diagnose and correct the fault.

Figure 7:
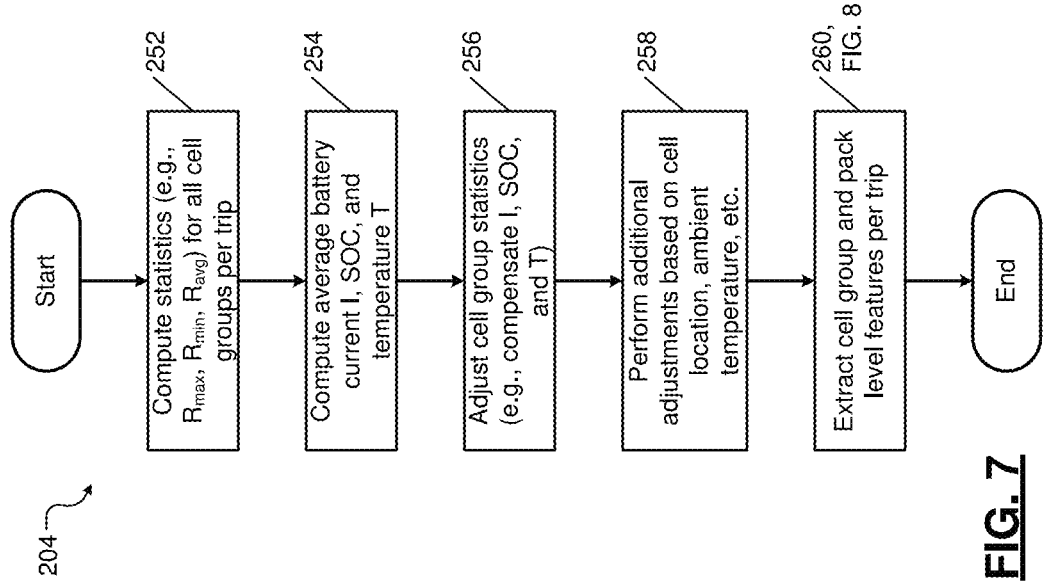
FIGS. 7 and 8 show a portion of the method of FIG. 6 for constructing pack level features from cell group level features used to identify a faulty battery pack.
Figure 8:
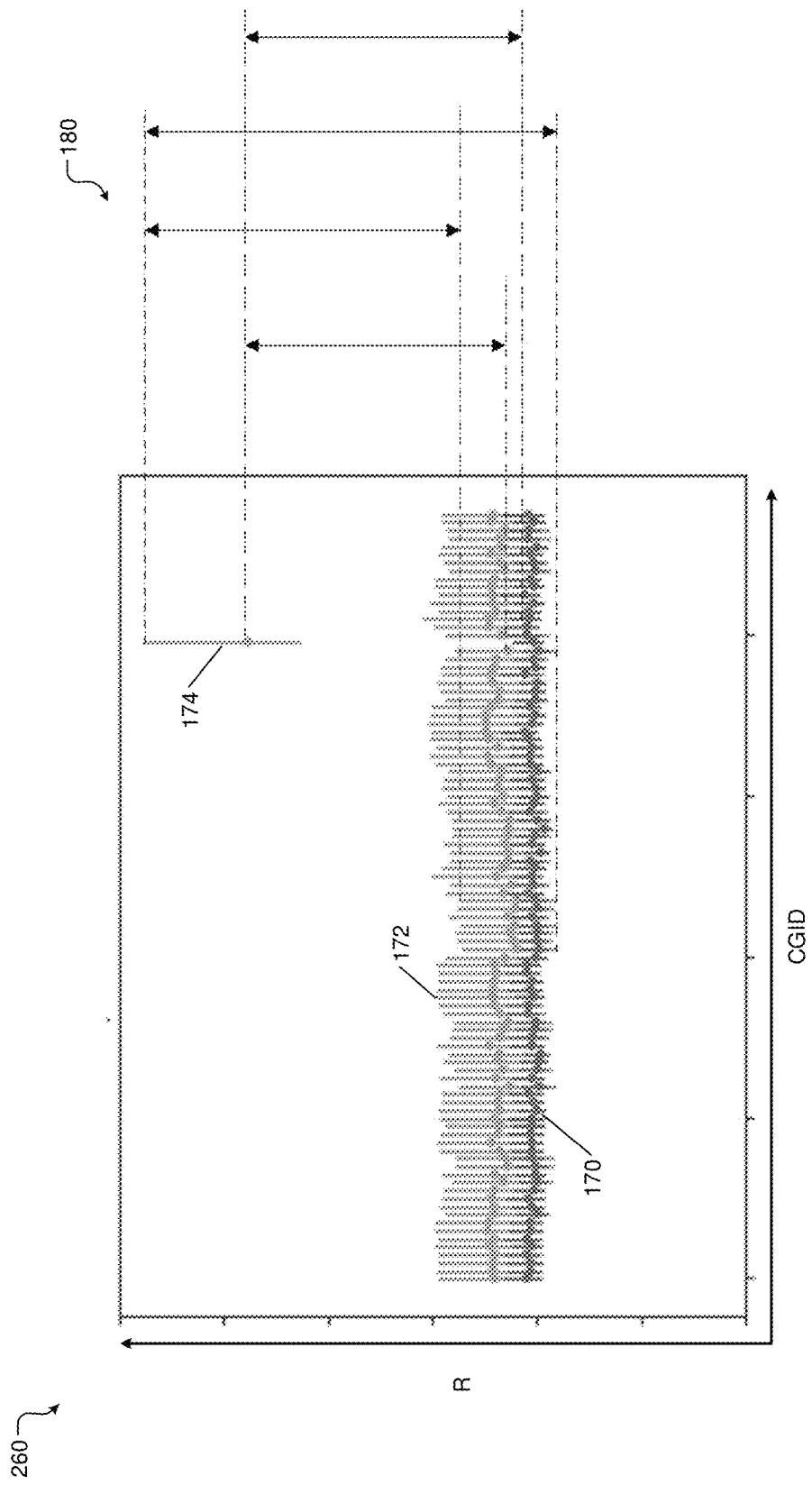

FIGS. 7 and 8 show the formulation of the pack level features from the cell group level features (i.e., the summary statistics) of the cell groups 150. FIG. 7 shows the step 204 of the method 200 in further detail. In FIG. 7, at 252, the method 200 computes the summary statistics (i.e., the cell group level features for all the cell groups 150) per trip. These may be pre-computed and stored in the memory 148 of the controller 104. As described above, these statistics include $R_{max}$, $R_{min}$, $R_{avg}$, and other values for all the cell groups 150. Accordingly, the step 252 is shown only for completeness.

At 254, the method 200 measures/computes the average current I, average SOC, and average temperature T of the battery 104. These measurements may also be pre-computed and stored in the memory 148 of the controller 104. At 256, the method 200 adjusts (e.g., compensates) the cell group statistics $R_{max}$, $R_{min}$, $R_{avg}$, and other values based on the average current I, the average SOC, and the average temperature T of the battery 104.

At 258, the method 200 performs additional adjustments for the cell group statistics based on other factors that can impact the cell group statistics. For example, the other factors can include but are not limited to the locations of the cell groups within the battery pack, ambient temperature, and the difference between the ambient temperature and the average temperature T of the battery 104.

These adjustments refine the cell group statistics and compensate them for noise and environmental factors. The compensation makes the cell group level features and the pack level features derived based on the cell group level features robust. Due to the compensation, the determination of the health of the battery pack based on the pack level features and determination of the health of the cell groups based on the cell group level features are also robust.

At 260, the method 200 formulates pack level features based on the cell group level features as follows. FIG. 8 shows an example of spread of the internal resistances across the cell groups 150 in a battery pack. In FIG. 8, the internal resistances R of the cell groups 150 are plotted against the cell group IDs. The spread in the internal resistances of the cell groups 150 across the battery pack is used as an indicator of the health of the battery pack. The pack level features are derived from the cell group statistics as follows and are subsequently analyzed using a first level decision making procedure shown and described with reference to FIG. 9 to determine if the battery pack is faulty.

In FIG. 8, if the battery pack is healthy (i.e., if all of the cell groups 150 in the battery pack are operating normally and exhibiting no abnormal increase in internal resistance), the internal resistances of all of the cell groups 150 will be within a narrow range. For example, the dots shown at 170 represent average values of the internal resistances of the cell groups 150 when the battery pack is healthy.

However, if the internal resistance of one or more cell groups 150 in the battery pack deviates from the average internal resistance values of the normal cell groups (shown at 172), the deviation can be used as an indicator of an anomaly and to determine whether the battery is faulty. After determining using the first level procedure that the battery pack is faulty, the cell group level features are analyzed using a second level procedure to identify which cell group(s) 150 are contributing to the fault in the battery pack. Subsequently, the severity level of the fault (e.g., low, medium, high) is determined. An example of a cell group contributing to the fault in the battery pack with the highest deviation in its internal resistance from the internal resistances of the other cell groups 150 is shown at 174.

For example, suppose that the cell group statistics (i.e., the cell group level features) for each of the cell groups 150 in a battery pack include $R_{max}$, $R_{min}$, and $R_{avg}$. The following description is not limited to $R_{max}$, $R_{min}$, and $R_{avg}$. Additionally, other statistical parameters such as standard deviation, variance, and so on may also be included in the cell group statistics. Accordingly, many more or different pack level features can be derived in addition to those described below. Further, the pack level features need not be derived from the cell group level features for every cell group 150. Instead, the pack level features can be derived based on the cell group level features for every module in the battery pack, where each module comprises multiple cell groups 150.

For example, for a battery pack, using the cell group level features $R_{max}$, $R_{min}$, and $R_{avg}$ of the cell groups 150 in the battery pack, a first pack level feature (feature1) can be max $[R_{avg,i}]$–min $[R_{avg,i}]$. A second pack level feature (feature2) can be max $[R_{max,i}]$–min $[R_{max,i}]$. A third pack level feature (feature3) can be max $[R_{max,i}]$–min $[R_{min,i}]$. A fourth pack level feature (feature4) can be max $[R_{max,i}]$-avg $[R_{max,i}]$. A fifth pack level feature (feature5) can be max $[R_{avg,i}]$–avg $[R_{max,i}]$. A sixth pack level feature (feature6) can be max $[R_{avg,i}]$. A seventh pack level feature (feature7) can be max $[R_{avg,i}]$-max $[R_{min,i}]$. An eighth pack level feature (feature8) can be max $[R_{max,i}]$–max $[R_{min,i}]$, and so on, where i is the cell group ID (CGID). Some of these pack level features are generally shown at 180 in FIG. 8. These pack level features can be used as is or can also be normalized (e.g., based on the current I, SOC, or temperature of the battery pack) to determine if the battery pack is faulty using the first level procedure as follows.

Examples of the pack level features are shown in FIGS. 12A and 12B. For illustrative purposes, in the examples shown, all of the features are shown as failing (i.e., exceeding respective thresholds) for at least some of the cell groups 150. In the examples, the Y-axis represents the number of battery packs or vehicles, which is denoted as P; and the X-axis represents the spread of the internal resistances of the cell groups 150, which is denoted as ΔR. The number of cell groups 150 for which the pack level features are less than a predetermined threshold 180 (indicating that these cell groups 150 are healthy) are shown at 182; and the number of cell groups 150 for which the pack level features are greater than the predetermined threshold 180 (indicating that these cell groups 150 are faulty) are shown at 184. For convenience, identical reference numerals are used for all the pack level features shown in FIGS. 12A and 12B.

Figure 9:
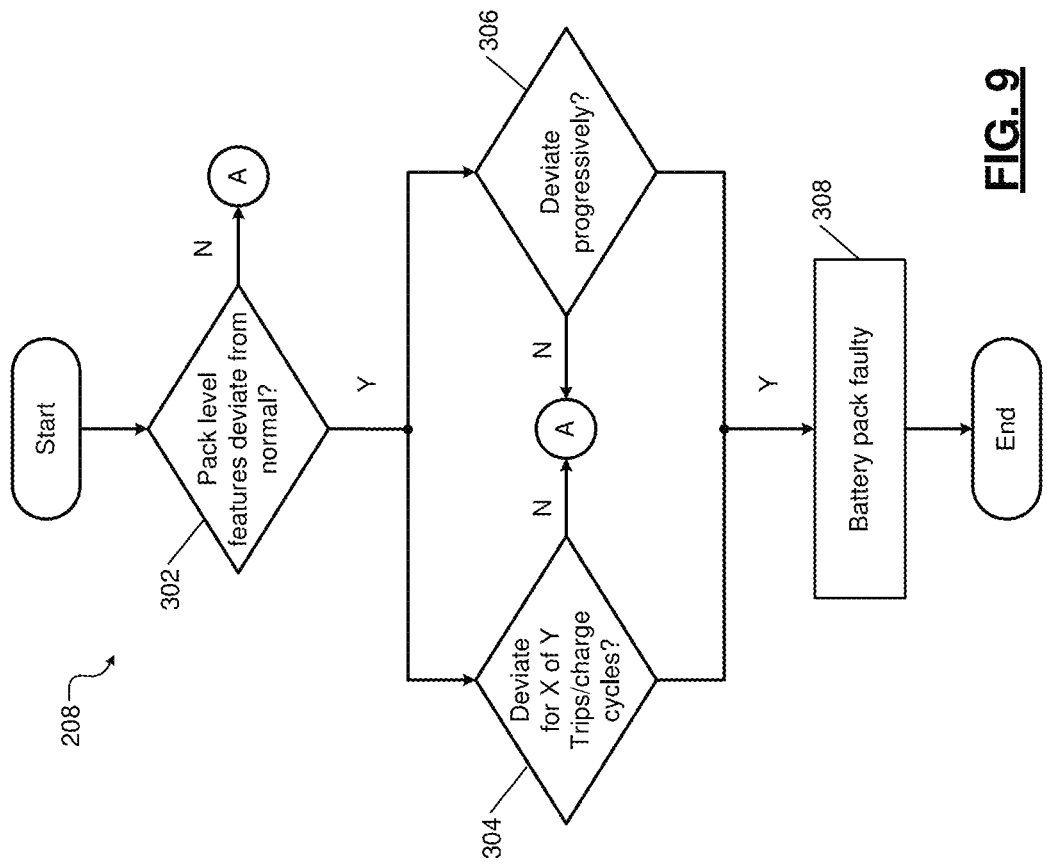
FIG. 9 shows a portion of the method of FIG. 6 for identifying a faulty battery pack in further detail.

FIG. 12A shows, from left to right and from top to bottom:
feature1: max $(R_{avg,i})$–min $(R_{avg,i})$
feature2: max $(R_{max,i})$–min $(R_{max,i})$
feature3: max $(R_{max,i})$–min $(R_{min,i})$
feature4: max $(R_{max,i})$–avg $(R_{max,i})$ FIG. 12B shows, from left to right and from top to bottom:
feature5: max $(R_{avg,i})$–avg $(R_{max,i})$
feature6: max $(R_{avg,i})$
feature7: max $(R_{avg,i})$-max $(R_{min,i})$
feature8: max $(R_{max,i})$-max $(R_{min,i})$ FIG. 9 shows the first level procedure used to determine if the battery pack is faulty. FIG. 9 shows the step 208 of the method 200 in further detail. The method 200 determines that the battery pack is faulty if any one or more of the pack level features is deviating from their respective thresholds. At 302, the method 200 determines if one or more of the pack level features is deviating from its normal value. For example, the normal value for each pack level feature can be calibrated empirically using a known healthy battery pack. Threshold levels for the pack level features can also be similarly calibrated to identify a fault in the battery pack. If none of the pack level features deviates from respective normal value (i.e., does not exceed a respective threshold), the method 200 determines that the battery pack is not faulty, and the method returns to step 202 shown in FIG. 6. If one or more pack level features deviate from their respective normal values (i.e., exceed respective thresholds), the method 200 determines that the battery pack is faulty.

Alternatively, if one or more pack level features deviate from their respective normal values (i.e., exceed respective thresholds), the method 200 can perform the following additional steps (304 or 306) before concluding that the battery pack is faulty. At 304, the method 200 determines if one or more pack level features deviate from their respective normal values for only X of Y trips, where X is a positive integer less than Y. If one or more pack level features does not deviate from their respective normal values for X of Y trips, the method 200 determines that the battery pack is not faulty (e.g., the fault indication may be an aberration), and the method 200 returns to step 202 shown in FIG. 6. If one or more pack level features deviate from their respective normal values for X out of Y trips, at 308, the method 200 determines that the battery pack is faulty.

As an alternative to step 304, at 306, the method 200 determines if one or more pack level features deviate from their respective normal values progressively (i.e., if the deviation increases in successive trips). If one or more pack level features do not deviate from their respective normal values progressively, the method 200 determines that the battery pack is not faulty (e.g., the fault indication may be an aberration), and the method returns to step 202 shown in FIG. 6. If one or more pack level features deviate from their respective normal values progressively, at 308, the method 200 determines that the battery pack is faulty. Steps 304 or 306 can be performed to confirm fault determination in step 302.

If the battery 104 comprises more than one battery pack, the method 200 can identify which one of the battery packs is faulty by repeating the procedure described above for each battery pack. Once the method 200 determines that a battery pack is faulty, the method 200 performs a second level procedure described below for each faulty battery packs to determine which one of the cell groups 150 is contributing the most to the fault in the battery pack as follows.

Figure 10:
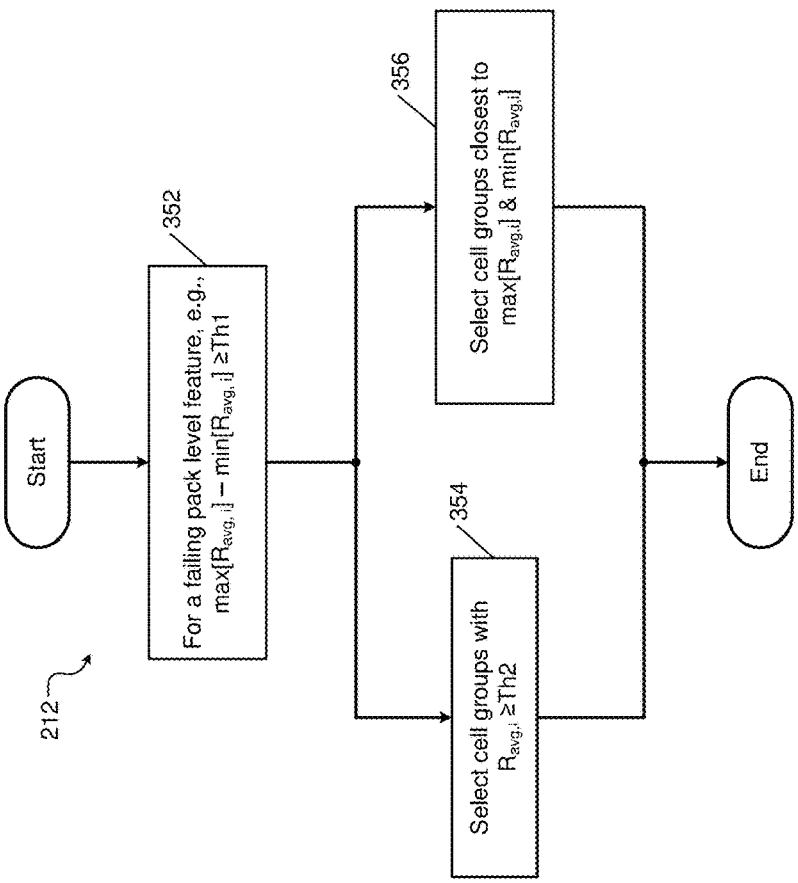
FIG. 10 shows a portion of the method of FIG. 6 for reducing a number of faulty cell groups to examine in further detail.

FIG. 10 shows a methodology used to reduce the number of faulty cell groups 150 for analysis by the second level procedure before determining which one of the faulty cell groups 150 is contributing the most to the fault in the battery pack. FIG. 10 shows the step 212 of the method 200 in further detail. The reduced number of faulty cell groups 150 can be analyzed using the second level procedure for determining which one of the cell groups 150 is contributing the most to the fault in the battery pack. Alternatively, the second level procedure can be performed for all of the cell groups 150 in the faulty battery pack.

At 352, the method 200 selects the pack level feature that indicated that the battery pack is faulty. For example only, for illustrative purposes, suppose that the pack level feature, which indicated that the battery pack is faulty, is feature1: max $[R_{avg,i}]$–min $[R_{avg,i}] \geq Th1$. The methodology described below can be used for any pack level feature indicating that the battery pack is faulty. The method 200 can determine which one of the cell groups 150 in the faulty battery pack is contributing the most to the fault in the battery pack in one of two ways shown at 354 and 356.

Before describing steps 354 and 356, examples of three cell group level features $R_{avg}$, $R_{max}$, and $R_{min}$ for the cell groups 150 are shown in FIG. 13. In these examples, the Y-axis represents the number of battery packs or vehicles, which is denoted as P; and the X-axis represents the spread of the internal resistances of the cell groups 150, which is denoted as $\Delta R$. The number of cell groups 150 for which the cell group level features $R_{avg}$, $R_{max}$, and $R_{min}$ are less than a predetermined threshold 190 (indicating that these cell groups 150 are healthy) are shown at 192; and the number of cell groups 150 for which the cell group level features $R_{avg}$, $R_{max}$, and $R_{min}$ are greater than the predetermined threshold 190 (indicating that these cell groups 150 are faulty) are shown at 194. For convenience, identical reference numerals are used for all the cell group level features in the three graphs shown in FIG. 13.

In FIG. 10, at 354, the method 200 selects the cell groups 150 whose cell group level feature $R_{avg}$ is greater than a predetermined threshold. Alternatively, the method 200 can select the cell groups 150 for which all three cell group level features $R_{avg}$, $R_{max}$, and $R_{min}$ are greater than respective predetermined thresholds. As an alternative to step 354, at 356, the method 200 can select cell groups 150 closest to max $[R_{avg,i}]$ & min $[R_{avg,i}]$. A similar methodology can be used for any other cell group level features (e.g., $R_{max}$ or $R_{min}$). The selection methodology reduces the number of faulty cell groups 150 for which the second level procedure is performed.

Figure 11:
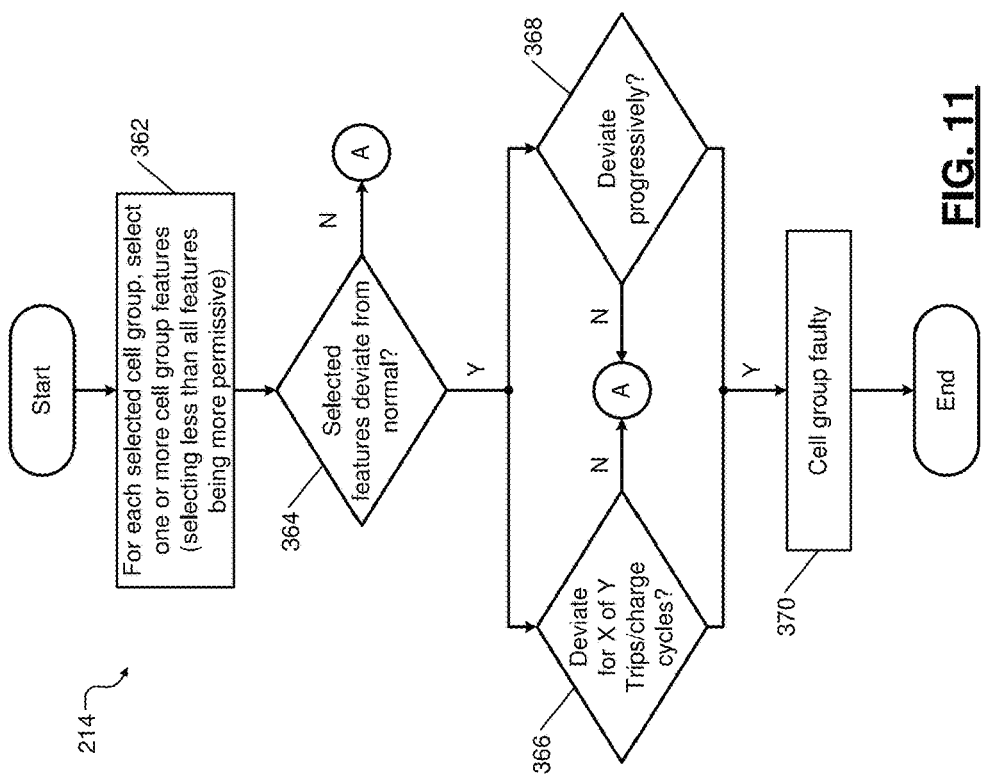
FIG. 11 shows a portion of the method of FIG. 6 for identifying faulty cell groups in further detail.

FIG. 11 shows the second level procedure performed to isolate which one of the cell groups 150 contributes the most to the fault in the battery pack. FIG. 11 shows the step 214 of the method 200 in further detail. At 362, for each selected cell group 150 (selected as described above with reference to FIG. 10), the method 200 selects one or more cell group level features. Selecting fewer than all of the cell group level features can be more permissive. That is, selecting all of the cell group level features for the selected cell group 150 can result in eliminating more of the cell groups 150 selected according to the methodology described above with reference to FIG. 10. Alternatively, selecting less than all of the cell group level features for the selected cell group 150 can result in eliminating fewer of the cell groups 150 selected according to the methodology descried above with reference to FIG. 10.

At 364, the method 200 determines if any (or all) of the selected cell group level feature(s) for the selected cell group 150 deviate(s) from respective normal value(s) by more than a predetermined amount (e.g., exceed respective threshold(s)). The normal values and the thresholds are calibrated empirically. The method 200 returns to step 202 shown in FIG. 6 if none of the selected cell group level feature(s) for the selected cell group 150 deviate(s) from respective normal value(s) by more than the predetermined amount. If one or more of the selected cell group level feature(s) deviate(s) from their respective normal values (i.e., exceed respective thresholds), the method 200 determines that the selected cell group 150 is faulty.

Alternatively, if one or more of the selected cell group level feature(s) deviate(s) from their respective normal values, the method 200 can perform the following additional steps (366 or 368) before concluding that the selected cell group 150 is faulty. At 366, the method 200 determines if one or more of the selected cell group level feature(s) deviate(s) from their respective normal values for only X of Y trips, where X is a positive integer less than Y. If one or more of the selected cell group level feature(s) does not deviate(s) from their respective normal values for X of Y trips, the method 200 determines that the selected cell group 150 is not faulty (e.g., the fault indication may be an aberration), and the method returns to step 202 shown in FIG. 6. If one or more of the selected cell group level feature(s) deviate(s) from their respective normal values for Y trips, at 370, the method 200 determines that the selected cell group 150 is faulty.

As an alternative to step 366, at 368, the method 200 determines if one or more of the selected cell group level feature(s) deviate(s) from their respective normal values progressively (i.e., if the deviation increases in successive trips). If one or more of the selected cell group level feature(s) do not deviate(s) from their respective normal values progressively, the method 200 determines that the selected cell group 150 is not faulty, and the method returns to step 202 shown in FIG. 6. If one or more of the selected cell group level feature(s) deviate(s) from their respective normal values progressively, at 370, the method 200 determines that the selected cell group 150 is faulty. Step 366 or 368 can be performed to confirm fault determination in step 364.

The method 200 indicates a severity level of the fault by calculating a severity index when both the battery pack is determined as being faulty and one or more of the cell groups 150 are determined as being faulty. For example, the severity index can be calculated using a sigmoid function. A sigmoid function has a characteristic "S"-shaped curve or sigmoid curve. A sigmoid function is a bounded, differentiable, and real function that is defined for all real input values and has a non-negative derivative at each point. In general, a sigmoid function is monotonic and has a first derivative that is bell-shaped. Conversely, the integral of any continuous and non-negative bell-shaped function (with one local maximum and no local minimum, unless degenerate) is sigmoidal. Additionally, the method 200 can also generate a weighted severity index called a historical severity index using the sigmoid function. The severity index can vary between 0 (low or no severity level) and 1 (high severity level). Accordingly, graded (e.g., low, medium, high) severity levels can be indicated on the infotainment subsystem 108 along with the fault information (e.g., which battery pack and which cell group(s) 150 are faulty).

The system and method of the present disclosure improves the battery technology. Specifically, the system and method passively identify faulty battery packs and cell groups in the battery while the vehicle is being driven without impacting driving. Further, the system and method identify faulty battery packs and cell groups in the battery proactively; that is, before a fault occurs and the vehicle stalls stranding the occupant. The system and method provide early fault indication and prognosis capability for predicting battery performance degradation while managing vehicle operation. The system and method monitor progressive trends in battery health and provide early warning (proactive alerts) to users ahead of a battery failure.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system for monitoring a battery of a vehicle, the system comprising:
   a processor; and
   a memory storing instructions which when executed by the processor configure the processor to:
      receive first features including statistics of internal resistances of a plurality of cell groups in a battery pack of the battery, wherein the first features include at least maximum, minimum, and average internal resistance values for each of the cell groups;
      compute second features for the battery pack using combinations of maximum, minimum, and average values of the first features, wherein the first features are adjusted based on one or more parameters of the battery before computing the second features based on the first features;
      determine that the battery pack is faulty in response to the one or more of the second features deviating from respective normal values by respective thresholds (i) for one or more drive cycles of the vehicle or (ii) progressively during a plurality of drive cycles of the vehicle, wherein a drive cycle is a trip made by the vehicle;
      determine, in response to the battery pack being faulty, whether one or more of the cell groups is faulty based on one or more of the first features;
      perform a severity assessment to provide at least one of detection and prediction of a failure in battery pack;
      proactively monitor failure progression and send a notification ahead of the failure to avoid a malfunction of the vehicle; and
      control an operation of the vehicle in response to a detected fault.

2. The system of claim 1 wherein the instructions further configure the processor to identify one or more of the faulty cell groups that contributes maximally to the faulty battery pack based on one of the second features indicating that the battery pack is faulty and the one or more of the first features of the faulty cell groups.

3. The system of claim 1 wherein the instructions further configure the processor to determine a fault severity level in response to the battery pack and the one or more of the cell groups being faulty.

4. The system of claim 3 wherein the instructions further configure the processor to provide an indication regarding the battery pack and the one or more of the cell groups being faulty and the fault severity level.

5. The system of claim 1 wherein the internal resistances of the cell groups include at least one of charge and discharge resistances of the cell groups.

6. The system of claim 1 wherein the instructions further configure the processor to determine that the one or more of the cell groups is faulty in response to the one or more of the first features deviating from respective normal values by respective thresholds (i) for the one or more drive cycles of the vehicle or (ii) progressively during the plurality of drive cycles of the vehicle.

7. The system of claim 1 wherein the instructions further configure the processor to normalize the second features based on the one or more parameters of the battery before determining whether the battery pack is faulty based on one or more of the second features.

8. A method for monitoring a battery of a vehicle, the method comprising:
- receiving first features including statistics of internal resistances of a plurality of cell groups in a battery pack of the battery, the statistics including at least maximum, minimum, and average internal resistance value for each of the cell groups;
- computing second features for the battery pack using combinations of maximum, minimum, and average values of the first features;
- adjusting the first features based on one or more parameters of the battery before computing the second features based on the first features;
- determining that the battery pack is faulty in response to the one or more of the second features deviating from respective normal values by respective thresholds (i) for one or more drive cycles of the vehicle or (ii) progressively during a plurality of drive cycles of the vehicle;
- determining, in response to the battery pack being faulty, whether one or more of the cell groups is faulty based on one or more of the first features;
- performing a severity assessment to provide at least one of detection and prediction of a failure in battery pack;
- proactively monitoring failure progression and sending a notification ahead of the failure to avoid a malfunction of the vehicle; and
- controlling an operation of the vehicle in response to a detected fault.

9. The method of claim 8 further comprising identifying one or more of the faulty cell groups that contributes maximally to the faulty battery pack based on one of the second features indicating that the battery pack is faulty and the one or more of the first features of the faulty cell groups.

10. The method of claim 8 further comprising determining a fault severity level in response to the battery pack and the one or more of the cell groups being faulty.

11. The method of claim 10 further comprising providing an indication regarding the battery pack and the one or more of the cell groups being faulty and the fault severity level.

12. The method of claim 8 further comprising determining the internal resistances of the cell groups including at least one of charge and discharge resistances of the cell groups.

13. The method of claim 8 further comprising determining that the one or more of the cell groups is faulty in response to the one or more of the first features deviating from respective normal values by respective thresholds (i) for the one or more drive cycles of the vehicle or (ii) progressively during the plurality of drive cycles of the vehicle.

14. The method of claim 8 further comprising normalizing the second features based on the one or more parameters of the battery before determining whether the battery pack is faulty based on one or more of the second features.

* * * * *